(12) United States Patent
Erdogan et al.

(10) Patent No.: US 7,587,445 B2
(45) Date of Patent: *Sep. 8, 2009

(54) COMPLEX MULTIPLEX FEEDBACK FILTER

(75) Inventors: Ozan E. Erdogan, Campbell, CA (US); Cormac Conroy, Sunnyvale, CA (US)

(73) Assignee: QUALCOMM, Incorporated, San Diego, CA (US)

( * ) Notice: Subject to any disclaimer, the term of this patent is extended or adjusted under 35 U.S.C. 154(b) by 698 days.

This patent is subject to a terminal disclaimer.

(21) Appl. No.: 11/253,478

(22) Filed: Oct. 18, 2005

(65) Prior Publication Data

US 2006/0053193 A1    Mar. 9, 2006

Related U.S. Application Data (63) Continuation of application No. 10/003,724, filed on Nov. 14, 2001, now Pat. No. 6,976,051.

(51) Int. Cl.
*G06G 7/02* (2006.01)

(52) U.S. Cl. .................................... 708/819

(58) Field of Classification Search .................. 708/819
See application file for complete search history.

(56) References Cited

U.S. PATENT DOCUMENTS 6,417,737 B1 * 7/2002 Moloudi et al. ............. 330/301

OTHER PUBLICATIONS

Bahbahani, Farbod, et al., "CMOS Mixers and Polyphase Filters for Large Image Rejection", IEEE Journal ofSolid-State Circuits, vol. 36, No. 6, Jun. 2001, p. 873.
Hornak, Thomas, et al., An Image-Rejecting Mixer and Vector Filter with 55-dB Image Rejection over Process, Temperature , and Transistor Mismatch, IEEE Journal of Solid-State Circuits, vol. 36, No. 1, Jan. 2001.

\* cited by examiner

*Primary Examiner*—Tan V Mai
(74) *Attorney, Agent, or Firm*—Abdollah Katbab; Ramin Mobarhan (57) ABSTRACT

A complex filter includes an I channel having a first I channel output and a second I channel output and a Q channel having a first Q channel output and a second Q channel output. The second I channel output is input to the Q channel through a first passive network and wherein the second Q channel output is input to the I channel through a second passive network.

24 Claims, 10 Drawing Sheets

COMPLEX MULTIPLEX FEEDBACK FILTER

CROSS REFERENCE TO OTHER APPLICATIONS

This application is a continuation of U.S. patent application Ser. No. 10/003,724, entitled COMPLEX MULTIPLE FEEDBACK FILTER filed Nov. 14, 2001 now U.S. Pat. No. 6,976,051 which is incorporated herein by reference for all purposes.

FIELD OF THE INVENTION

The present invention relates generally to a filter. An image rejection filter with two poles per op amp is disclosed.

BACKGROUND OF THE INVENTION

Figure 1:
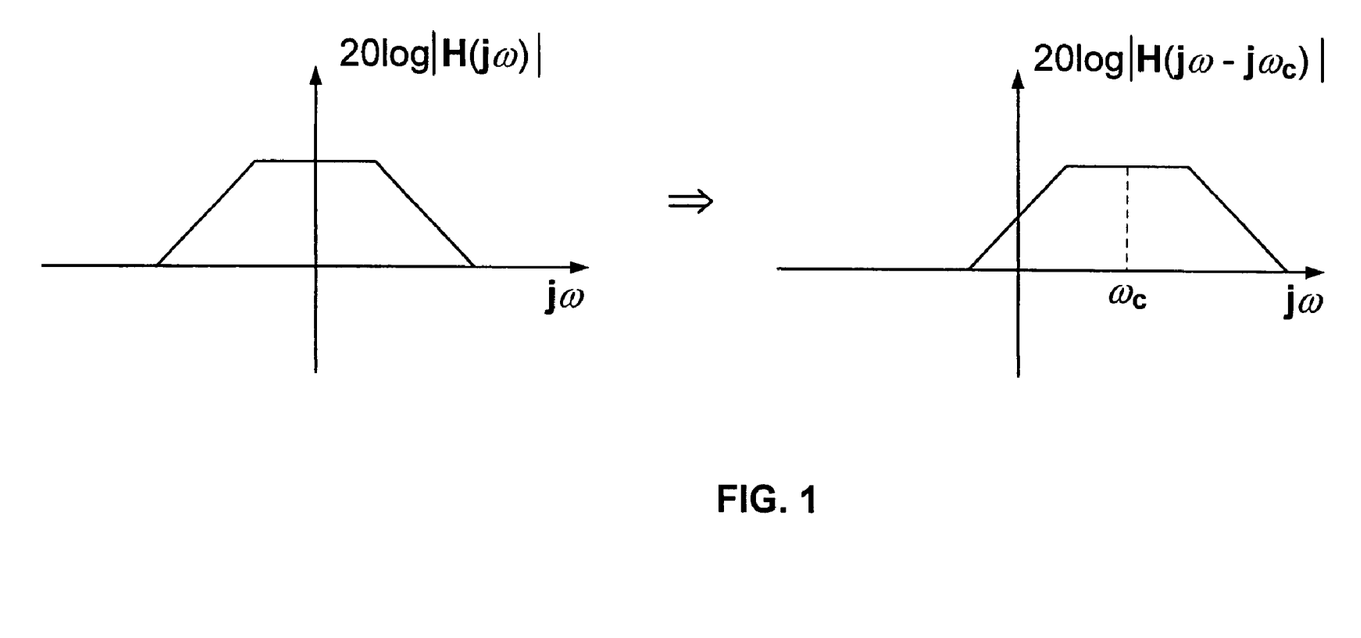
FIG. 1 is a diagram illustrating a low pass to bandpass filter transformation.
Figure 2:
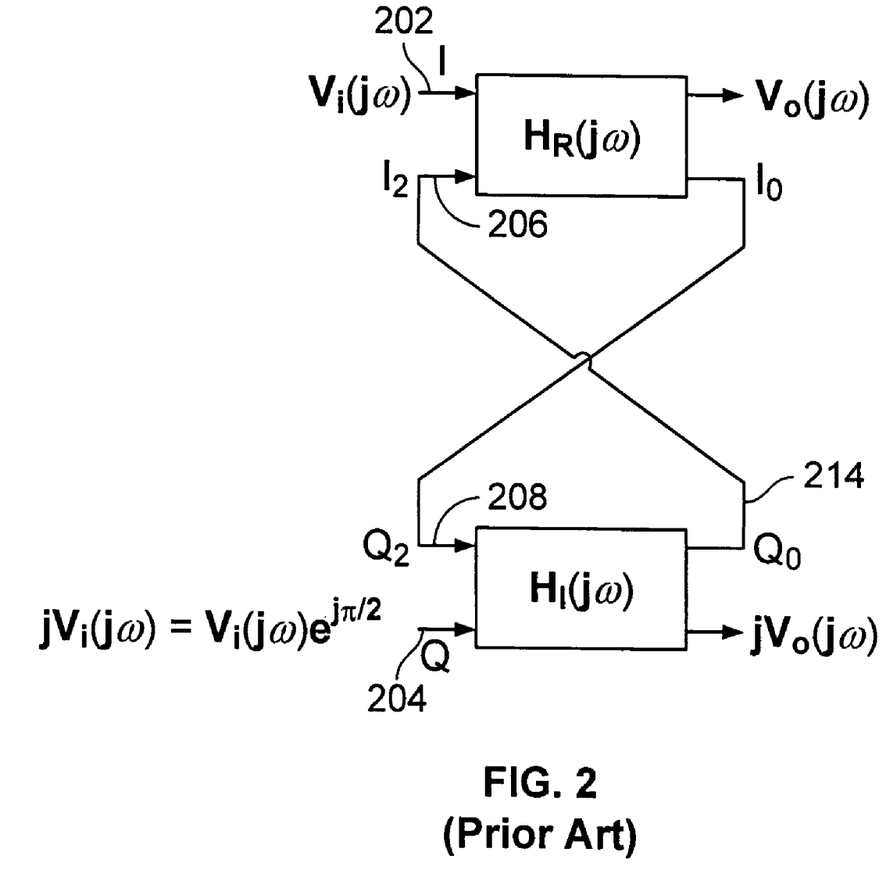
FIG. 2 is a block diagram illustrating an implementation of such a complex filter.

There is a need for better image rejection filters to be used in wireless systems. In general, an image rejection filter is implemented as a bandpass filter that passes only positive frequencies. Since the magnitude of the transfer function is not symmetric about DC, the transfer function is complex. FIG. 1 is a diagram illustrating a low pass to bandpass filter transformation. Since the filter shown requires complex signals, it needs to be implemented as a filter with two real inputs. FIG. 2 is a block diagram illustrating an implementation of such a complex filter. Input 202 is referred to as the in phase or I input and input 204 is referred to as the quadrature or Q input. As shown in FIG. 2, the I channel and the Q channels are linked. An output QO of the Q channel 214 is fed into a second input I2 to the I channel 206. Likewise, an output IO of the I channel 212 is fed into a second input Q2 to the Q channel 208.

Ideally, to implement a complex filter as shown in FIG. 2 it would be useful to have a filter that has a minimum number of op amps or other active components. "CMOS Mixers and Polyphase Filters for Large Image Rejection" by Farbod Behbahani, Yoji Kishigami, John Leete, and Asad A. Abidi, published in the IEEE Journal of Solid-State Circuits, Vol. 36, No. 6, June 2001, page 873 and 878 describes a polyphase multiple pole filter that includes several RC stages. The design is useful, but it is difficult to implement desired types of bandpass filters and the multiple stages attenuate the signal so that amplification of the output is required. "An Image-Rejecting Mixer and Vector Filter with 55-dB Image Rejection over Process, Temperature, and Transistor Mismatch," Thomas Hornak, Knud L. Knudsen, Anderew Z. Grezegorek, Ken A. Nishimura, and William J. McFarland, IEEE Journal of Solid-State Circuits, Vol. 36, No. 1, January 2001, page 23 and 26 describes an image rejection filter that integrates op amps into the filter design so that amplification is built into the filter. This design also has the advantage that desired types of bandpass filter responses can be implemented. However, the illustrated design only provides one pole per op amp. A complex multiple pole filter therefore would require an op amp for each pole in each channel. It would be desirable if a filter could be designed that could be used in an image rejection system and would use fewer op amps per pole. Such a filter could use less power and take up less space on a chip than currently available designs.

SUMMARY OF THE INVENTION

A complex multiple feedback filter is disclosed. A multiple feedback filter that realizes two poles and a single op amp is implemented in the I and Q channels. A first linking network of capacitors and resistors links a Q channel output back to an I channel input and a second linking network of capacitors and resistors links an I channel output back to a Q channel input. In this manner, a complex filter is implemented with two poles and only one op amp in the I channel and one op amp in the Q channel. Higher order complex filters can be implemented by cascading the two pole filter design.

It should be appreciated that the present invention can be implemented in numerous ways, including as a process, an apparatus, a system, a device, a method, or a computer readable medium such as a computer readable storage medium or a computer network wherein program instructions are sent over optical or electronic communication links. Several inventive embodiments of the present invention are described below.

In one embodiment, a complex filter includes an I channel having a first I channel output and a second I channel output and a Q channel having a first Q channel output and a second Q channel output. The second I channel output is input to the Q channel through a first passive network and wherein the second Q channel output is input to the I channel through a second passive network.

These and other features and advantages of the present invention will be presented in more detail in the following detailed description and the accompanying figures which illustrate by way of example the principles of the invention.

BRIEF DESCRIPTION OF THE DRAWINGS

The present invention will be readily understood by the following detailed description in conjunction with the accompanying drawings, wherein like reference numerals designate like structural elements, and in which.

DETAILED DESCRIPTION

A detailed description of a preferred embodiment of the invention is provided below. While the invention is described in conjunction with that preferred embodiment, it should be understood that the invention is not limited to any one embodiment. On the contrary, the scope of the invention is limited only by the appended claims and the invention encompasses numerous alternatives, modifications and equivalents. For the purpose of example, numerous specific details are set forth in the following description in order to provide a thorough understanding of the present invention. The present invention may be practiced according to the claims without some or all of these specific details. For the purpose of clarity, technical material that is known in the technical fields related to the invention has not been described in detail so that the present invention is not unnecessarily obscured.

Figure 3:
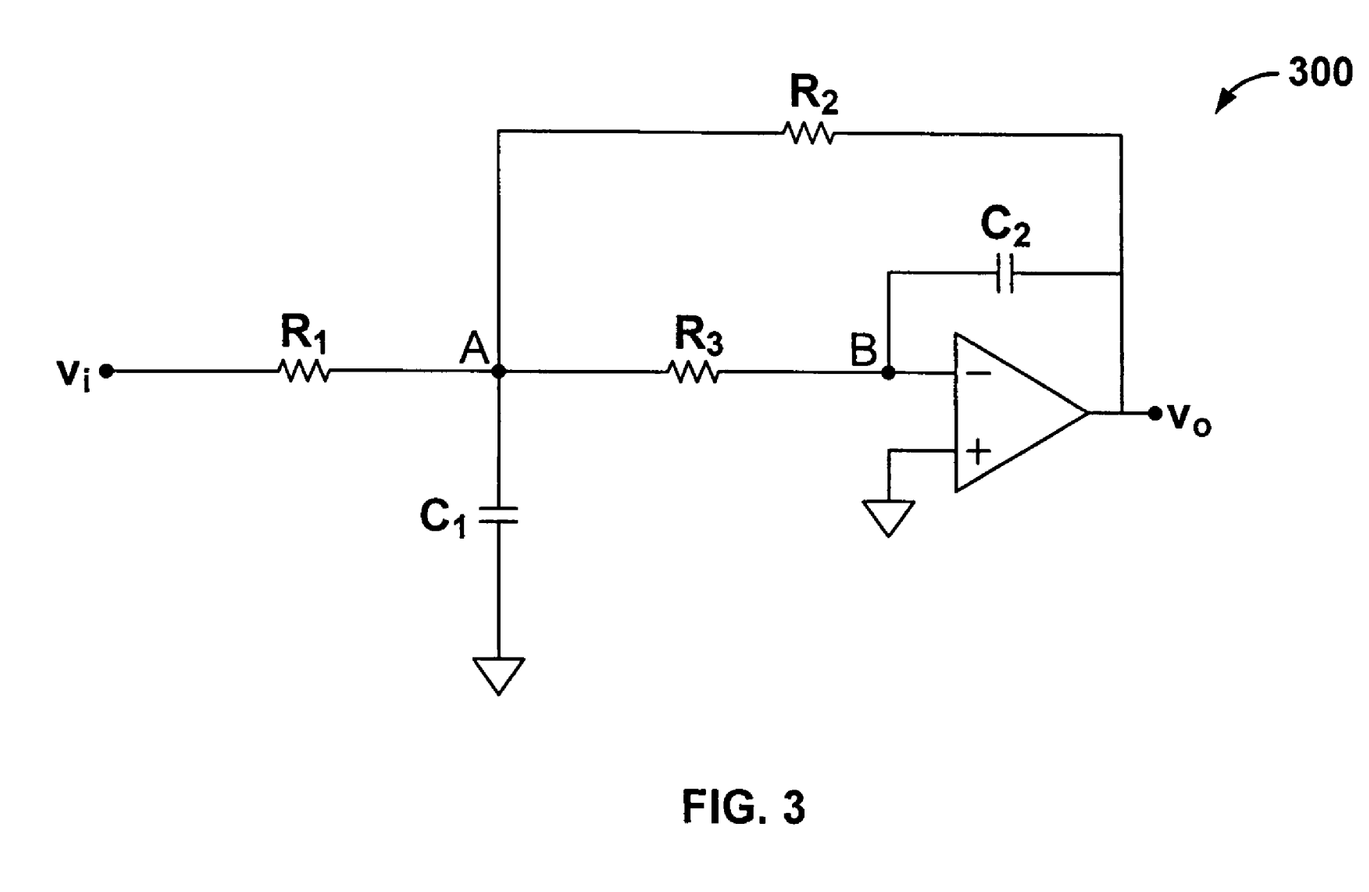
FIG. 3 is a block diagram illustrating a multiple feedback filter 300 with a second order transfer function having 2 poles and a single op amp.

FIG. 3 is a block diagram illustrating a multiple feedback filter 300 with a second order transfer function having 2 poles and a single op amp.

The design equations can be derived as follows:
KCL at node A:

$$\frac{(v_i - v_{C_1})}{R_1} - sC_1 v_{C_1} + \frac{(v_o - v_{C_1})}{R_2} - \frac{v_{C_1}}{R_3} = 0 \quad (1)$$

After rearrangement:

$$\frac{v_i}{R_1} = -\frac{v_o}{R_2} + v_{C_1}\left(\frac{1}{R_1} + \frac{1}{R_2} + \frac{1}{R_3} + sC_1\right) \quad (2)$$

KCL at Node B:

$$\frac{v_{C_1}}{R_3} + sC_2 v_o = 0 \Rightarrow v_{C_1} = -v_o s R_3 C_2 \quad (3)$$

Substituting (3) in (2):

$$\frac{v_i}{R_1} = -v_o\left[sR_3 C_2\left(\frac{1}{R_1} + \frac{1}{R_2} + \frac{1}{R_3} + sC_1\right) + \frac{1}{R_2}\right] \quad (4)$$

$$\frac{v_o}{v_i}(s) = \frac{H_0 \omega_0^2}{s^2 + \frac{\omega_0}{Q}s + \omega_0^2} \quad (5)$$

$$= \frac{-\frac{R_2}{R_1}\frac{1}{C_1 C_2 R_2 R_3}}{s^2 + \frac{1}{C_1}\left(\frac{1}{R_1} + \frac{1}{R_2} + \frac{1}{R_3}\right)s + \frac{1}{C_1 C_2 R_2 R_3}} \quad (6)$$

By inspection:

$$H_o = -\frac{R_2}{R_1} \quad (7)$$

$$\omega_o^2 = \frac{1}{C_1 C_2 R_2 R_3} \quad (8)$$

$$\frac{\omega_o}{Q} = \frac{1}{C_1}\left(\frac{1}{R_1} + \frac{1}{R_2} + \frac{1}{R_3}\right) \quad (9)$$

As can be seen from equation (6), multiple feedback filter 300 has a second order transfer function as desired. To implement an arrangement as shown in FIG. 2, filter 300 is configured to receive two inputs and to have an ouput that drives a filter in another channel. In one embodiment, one second order filter per channel each having a single op amp is implemented using the configuration derived below.

Figure 4:
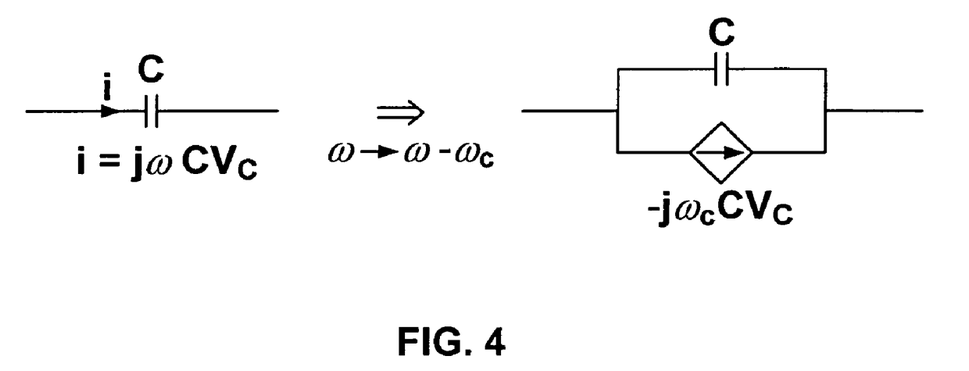
FIG. 4 is a block diagram illustrating a filter.

If the original transfer function is $H(j\omega)$, the complex band-pass transfer function is $H(j\omega')$ where $\omega' = \omega - \omega_c$. Since the only frequency dependent components of the filter shown in FIG. 1 are capacitors, the complex filter can be obtained from the circuit by transforming each capacitor to a composite device as shown in FIG. 4.

Figure 5:
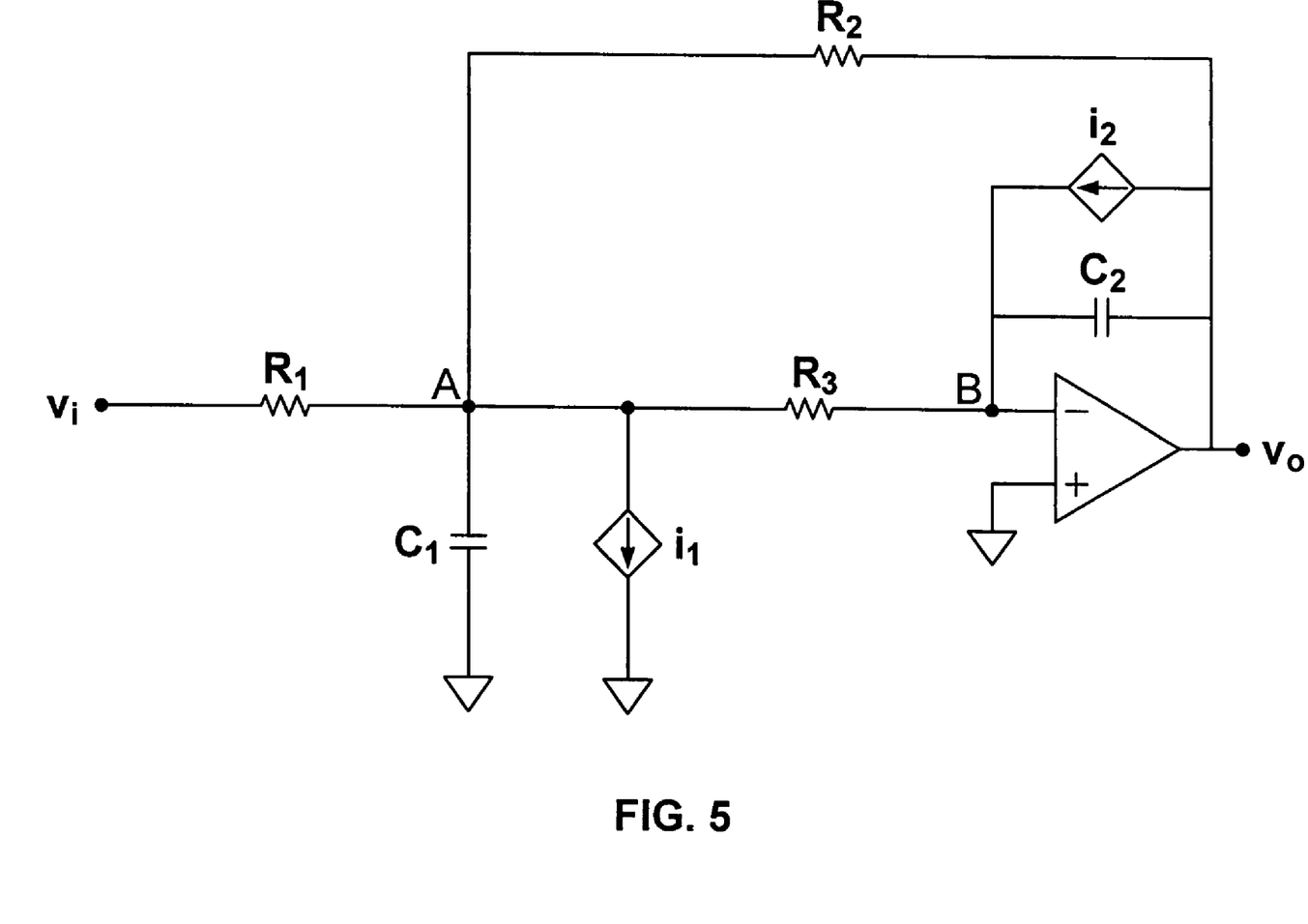
FIG. 5 is a block diagram illustrating a filter.

The resulting filter would look like FIG. 5 with:

$$i_1 = -j\omega_c C_1 v_A \quad (10)$$

$$i_2 = -j\omega_c C_2 v_o \quad (11)$$

Consider two such filters $H_R$ and $H_I$ such that $H_R$ is excited wit the input signal $v_i$ and $H_I$ is excited by $jv_i$. Denote the nodes voltages of the corresponding filter with $v^*_A$ and $v^*_o$. In other words:

$$i_1 = -\omega_c C_1 v^*_A \quad (12)$$

$$i_2 = -\omega_c C_2 v^*_o \quad (13)$$

The controlled current source in FIG. 5 subtracts current from node A and depends on the voltage $v^*_A$ with the coefficient $-\omega_c C_1$. This current source cannot be implemented with passive components because adding passive components to node A changes the transfer function. Furthermore the current depends on the voltage of the corresponding node, A*, in the complex filter. However, nodes A and A* are not low impedance nodes; therefore, they cannot drive impedances without buffers.

In general, it is desired that the driving point for the outputs to the other channel is at the op amp output so that there is low impedance. Also, it is desired that the mixing point at the input is at the op amp input where there is a virtual ground.

A suitable implementation can be obtained first using $v^*_o$ as the controlling voltage rather than $v^*_A$:

$$i_1 = -\omega_c C_1 v^*_A \quad (14)$$

$$= -\omega_c C_1 \frac{v_A}{v_o} v^*_o \quad \left(\text{Note}: \frac{v_A}{v_o} = \frac{v^*_A}{v^*_o}\right) \quad (15)$$

The transfer function $v_A/v_o$ can be found by inspection:

$$\frac{v_A}{v_o} = -R_3 C_2 (s - j\omega_c) \quad (16)$$

Figure 6:
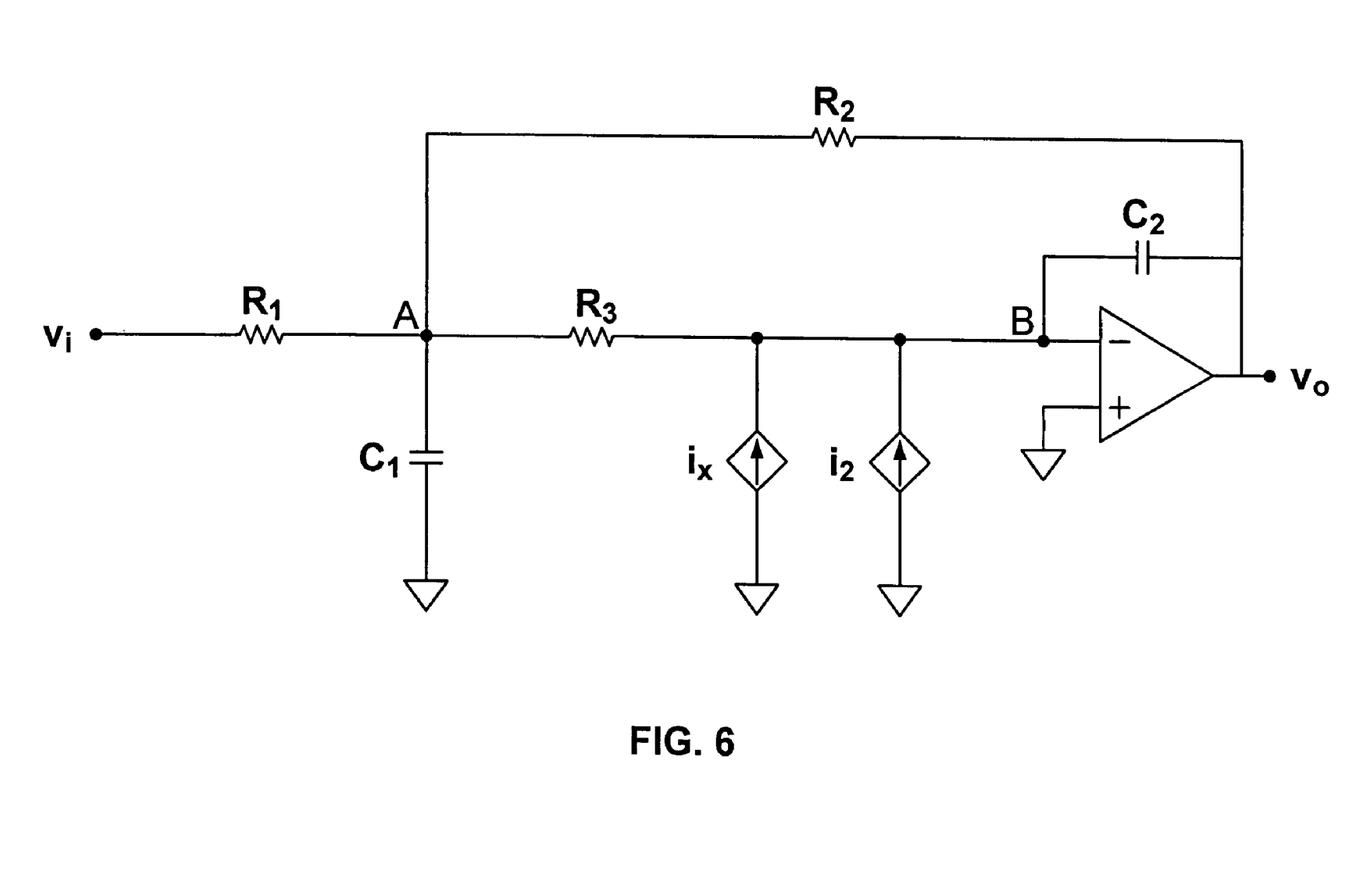
FIG. 6 is a diagram illustrating a desired filter configuration.

The next step is to use the op-amp input as the current summing junction. With this change, passive components between the op-amp inputs and outputs of the complex filters can be used for the cross-coupling elements. FIG. 6 is a diagram illustrating the desired configuration. The controlled current source $i_2$ can be moved to between op-amp input and ground without changing the transfer function. Replacing $i_1$ with $i_x$ should produce the same output voltage $v_o$. KCL at node A in FIG. 5:

$$\frac{v_A}{R_1} + sC_1 + \frac{v_A}{R_3} + \frac{v_A - v_o}{R_2} + i_1 = 0 \quad (17)$$

$$v_A\left(\frac{1}{R_1} + \frac{1}{R_2} + \frac{1}{R_3} + sC_1\right) = \frac{v_o}{R_2} - i_1 \quad (18)$$

Using (16):

$$-v_o R_3 C_2 (s - j\omega_c)\left(\frac{1}{R_1} + \frac{1}{R_2} + \frac{1}{R_3} + sC_1\right) = \frac{v_o}{R_2} - i_1 \quad (19)$$

Finally, $$v_o = i_1 \frac{1}{R_3 C_2 (s - j\omega_c)\left(\frac{1}{R_1} + \frac{1}{R_2} + \frac{1}{R_3} + sC_1\right) + \frac{1}{R_2}} \quad (20)$$

The output, $v_o$ in FIG. 6 can be found similarly. KCL at node A:

$$v_A\left(\frac{1}{R_1} + \frac{1}{R_2} + \frac{1}{R_3} + sC_1\right) = \frac{v_o}{R_2} \quad (21)$$

KCL at node B:

$$\frac{v_A}{R_3} + i_x + v_o C_2 (s - j\omega_c) = 0 \quad (22)$$

$$v_A = -i_x R_3 - v_o R_3 C_2 (s - j\omega_c) \quad (23)$$

Substituting (23) in (21):

$$\frac{v_o}{R_2} = -v_o R_3 C_2 (s - j\omega_c)\left(\frac{1}{R_1} + \frac{1}{R_2} + \frac{1}{R_3} + sC_1\right) - i_x R_3\left(\frac{1}{R_1} + \frac{1}{R_2} + \frac{1}{R_3} + sC_1\right) \quad (24)$$

$$v_o = \frac{-i_x R_3\left(\frac{1}{R_1} + \frac{1}{R_2} + \frac{1}{R_3} + sC_1\right)}{R_3 C_2 (s - j\omega_c)\left(\frac{1}{R_1} + \frac{1}{R_2} + \frac{1}{R_3} + sC_1\right) + \frac{1}{R_o}} \quad (25)$$

Equating (20) and (25):

$$i_x = \frac{-z_1}{R_3\left(\frac{1}{R_1} + \frac{1}{R_2} + \frac{1}{R_3} + sC_1\right)} \quad (26)$$

$$= \frac{i_1}{R_3 C_1}\left(\frac{1}{s + \frac{\omega_0}{Q}}\right) \quad (27)$$

Using (27), (16), and (15):

$$i_x = -\omega_c C_1 [-R_3 C_2 (s - j\omega_c)]\frac{-1}{R_3 C_1\left(s + \frac{\omega_0}{Q}\right)} v_o^* \quad (28)$$

$$= -\frac{\omega_c C_2 (s - j\omega_c)}{s + \frac{\omega_0}{Q}} v_o^* \quad (29)$$

$$= -\frac{\omega_c C_2}{s + \frac{\omega_0}{Q}} v_o^* - \frac{\omega_c^2 C_2}{s + \frac{\omega_0}{Q}} v_o \quad (30)$$

(Note: $jv_o^* = -v_o$)

Each term in (30) describes an admittance function. The first term has the form:

$$i = K\frac{s}{s+p}v \quad (31)$$

Figure 7:
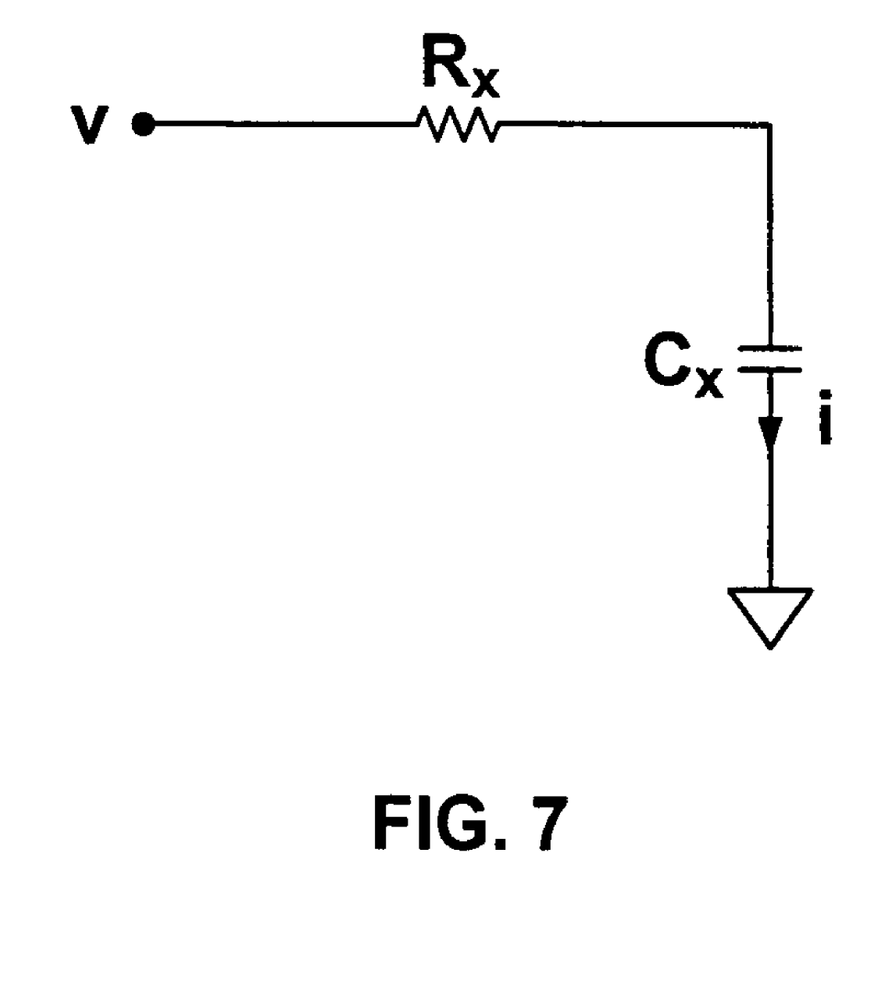
FIG. 7 is a diagram illustrating a passive network.

Consider the passive network in FIG. 7.

$$i = \frac{1}{R_x}\frac{s}{s + \frac{1}{R_x C_x}}v \quad (32)$$

Comparing terms:

$$R_x = \frac{1}{\omega_c C_2} \quad (33)$$

$$C_x = \frac{1}{R_x \frac{\omega_o}{Q}} \quad (34)$$

$$= \frac{\omega_c C_2}{\frac{\omega_o}{Q}} \quad (35)$$

The second term in (30) has the form:

$$i = K\frac{1}{s+p}v \quad (36)$$

Figure 8:
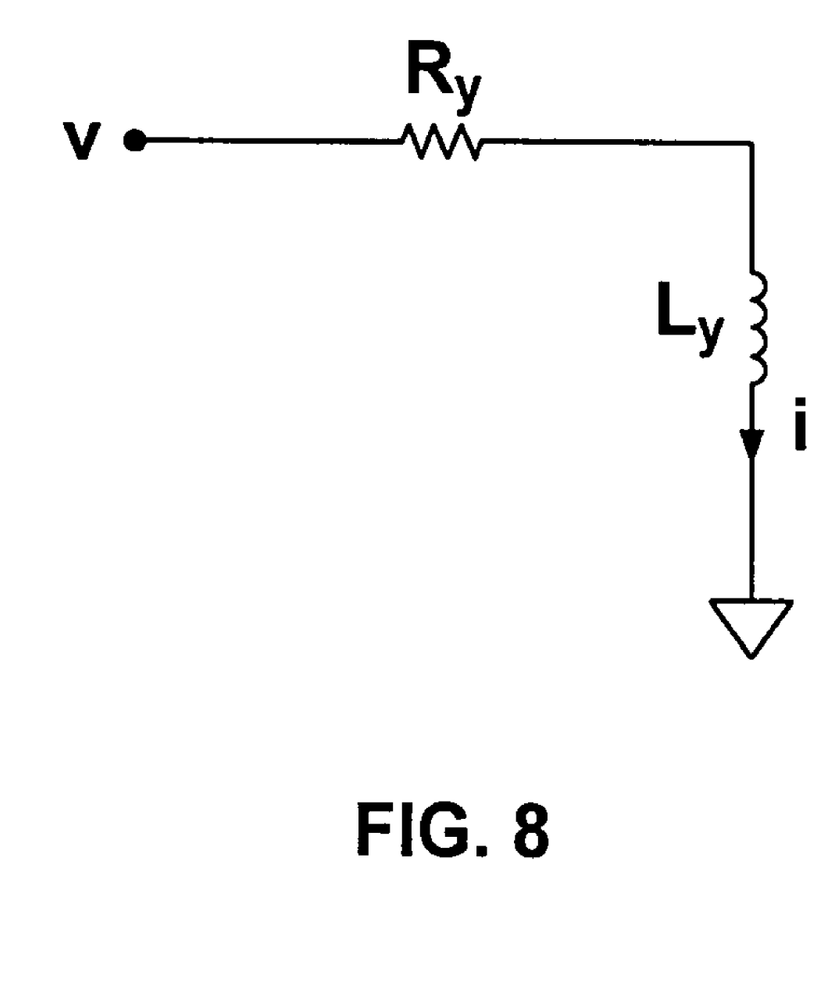
FIG. 8 is a diagram illustrating a network.

The natural choice is an R-L series network as in FIG. 8

$$i = \frac{1}{R_y + sL_y}v \quad (37)$$

$$= \frac{1}{L_y}\frac{1}{s + \frac{R_y}{L_y}} \quad (38)$$

Although the form of the transfer function is correct, the inductor is not suitable for IC implementation.

Figure 9:
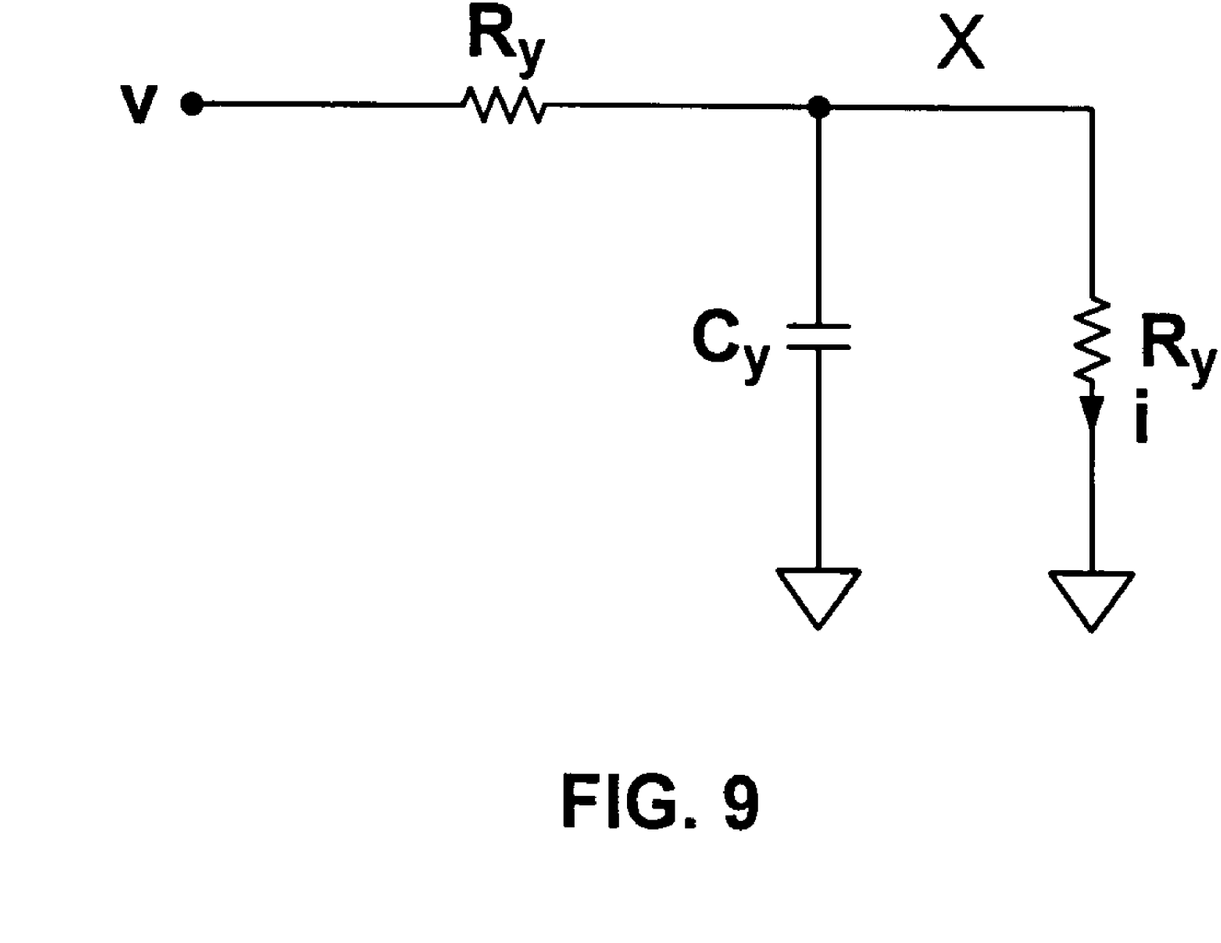
FIG. 9 is a diagram illustrating a network.

Consider the "T" network in FIG. 9

$$i = \frac{1}{R_y^2 C_y}\frac{1}{s + \frac{2}{R_y C_y}}v \quad (39)$$

Comparing terms:

$$R_y = \frac{1}{2\omega_c^2 C_2}\frac{\omega_0}{Q} \quad (40)$$

$$C_y = \frac{2}{R_y}\frac{1}{\frac{\omega_0}{Q}} \quad (41)$$

$$= 4\omega_c^2 C_2\left(\frac{\omega_0}{Q}\right)^2 \quad (42)$$

Figure 10:
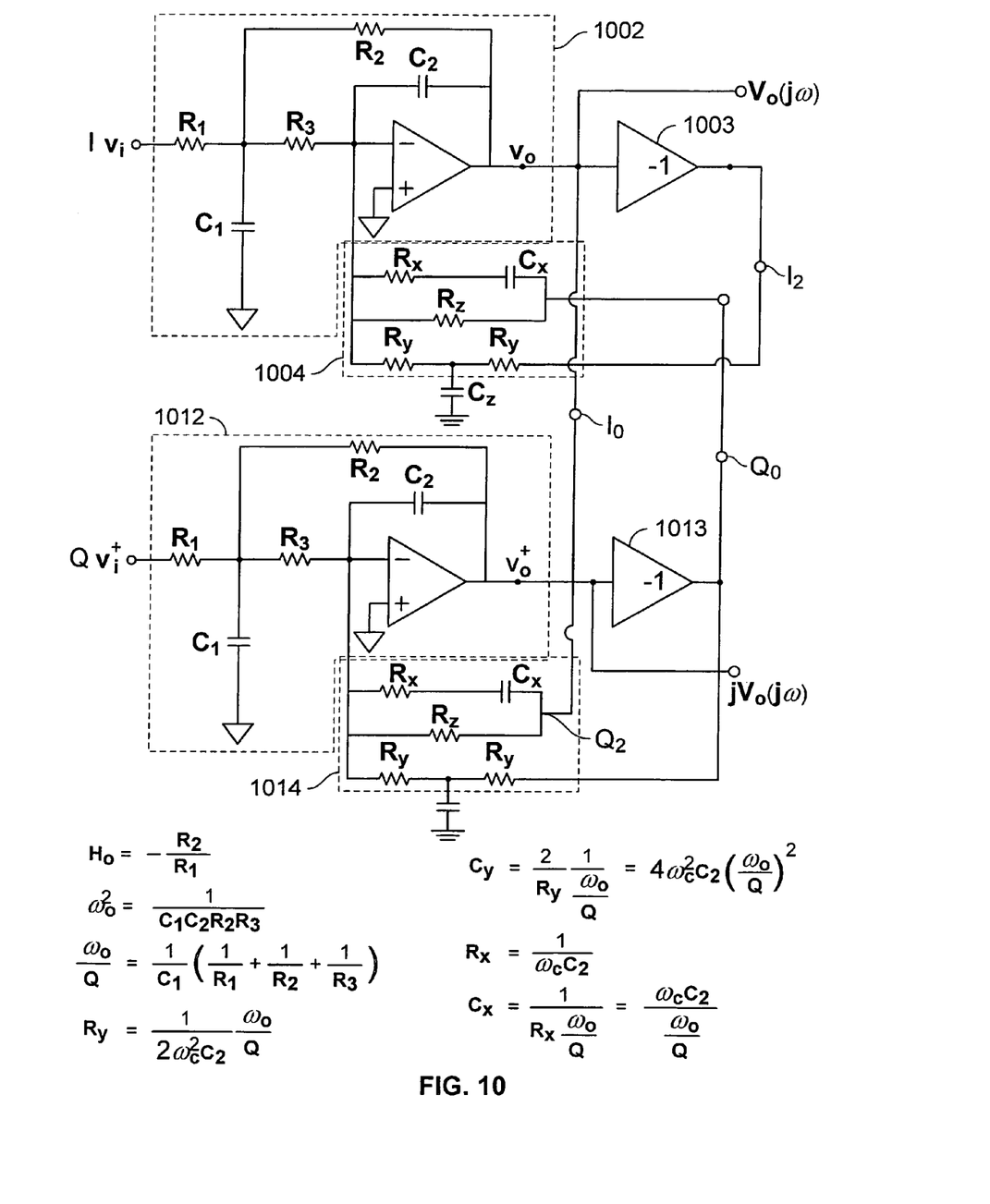
FIG. 10 is a block diagram illustrating two second order filters each implemented using a single op amp.

FIG. 10 is a block diagram illustrating two second order filters (one for each channel) each implemented using a single op amp. Resistor $R_z=1/\omega_c C_2$ implements the controlled current source $i_2$. Second order filter 1002 is implemented in the I channel and Second order filter 1012 is implemented in the Q channel. In the embodiment shown, inverting buffers 1003 and 1013 provide inverted outputs. In a fully differential implementation, both polarities of the output are available; therefore, the inverting buffers are not needed. Passive network 1004 enables an output IO from the I channel to be fed into input Q2 of the Q channel. Likewise, passive network 1014 enables an output QO from the Q channel to be fed into an input I2 of the I channel. It should be noted that the coupling network shown in FIG. 10 is exemplary and in other embodiments, other coupling networks are used.

A complex multiple feedback filter has been described. A multiple feedback filter that includes two poles and a single op amp is implemented in the I and Q channels. A first linking network of capacitors and resistors links a Q channel output back to an I channel input and a second linking network of capacitors and resistors links an I channel output back to a Q channel input. In this manner, a complex filter is implemented with two poles and only one op amp in the I channel and one op amp in the Q channel.

Although the foregoing invention has been described in some detail for purposes of clarity of understanding, it will be apparent that certain changes and modifications may be practiced within the scope of the appended claims. It should be noted that there are many alternative ways of implementing both the process and apparatus of the present invention. Accordingly, the present embodiments are to be considered as illustrative and not restrictive, and the invention is not to be limited to the details given herein, but may be modified within the scope and equivalents of the appended claims.

What is claimed is:

1. A multiple feedback filter comprising:
   one or more op amps implemented in an I or Q channel;
   a first linking network of at least one capacitor and at least one resistor linking a Q channel output back to an I channel input; and
   a second linking network of at least one capacitor and at least one resistor linking an I channel output back to a Q channel input.

2. A multiple feedback filter as recited in claim 1, wherein the first linking network is a passive network.

3. A multiple feedback filter as recited in claim 1, wherein the second linking network is a passive network.

4. A multiple feedback filter as recited in claim 1, wherein the multiple feedback filter is used for image rejection.

5. A multiple feedback filter as recited in claim 1, wherein the first linking network is a RC network.

6. A multiple feedback filter as recited in claim 1, wherein the second linking network is a RC network.

7. A multiple feedback filter as recited in claim 1, wherein the Q channel output is a low impedance output.

8. A multiple feedback filter as recited in claim 1, wherein the I channel output is a low impedance output.

9. A multiple feedback filter as recited in claim 1, wherein the Q channel output is at the output of at least one of the one or more op amps.

10. A multiple feedback filter as recited in claim 1, wherein the I channel output is at the output of at least one of the one or more op amps.

11. A multiple feedback filter as recited in claim 1, wherein the I channel output is input to the Q channel at an input of at least one of the one or more op amps.

12. A multiple feedback filter as recited in claim 1, wherein the Q channel output is input to the I channel at an input of at least one of the one or more op amps.

13. A method of linking channels in a multiple feedback filter comprising:
    linking a Q channel output to an I channel input through at least one capacitor and at least one resistor; and
    linking an I channel output to an Q channel input through at least one capacitor and at least one resistor.

14. A method as recited in claim 13, wherein the Q channel output is linked to the I channel input through a passive network.

15. A method as recited in claim 13, wherein the I channel output is linked the Q channel input through a passive network.

16. A method as recited in claim 13, wherein the multiple feedback filter is used for image rejection.

17. A method as recited in claim 13, wherein the at least one capacitor and the at least one resistor associated with the Q channel output and the I channel input are a part a RC network.

18. A method as recited in claim 13, wherein the at least one capacitor and the at least one resistor associated with the I channel output and the Q channel input are a part a RC network.

19. A method as recited in claim 13, wherein the Q channel output is a low impedance output.

20. A method as recited in claim 13, wherein the I channel output is a low impedance output.

21. A method as recited in claim 13, wherein the Q channel output is at the output of at least one op amp.

22. A method as recited in claim 13, wherein the I channel output is at the output of at least one op amp.

23. A method as recited in claim 13, wherein the I channel output is input to the Q channel at an input of at least one op amp.

24. A method as recited in claim 13, wherein the Q channel output is input to the I channel at an input of at least one op amp.

* * * * *

UNITED STATES PATENT AND TRADEMARK OFFICE
CERTIFICATE OF CORRECTION

| | | |
|---|---|---|
| PATENT NO. | : 7,587,445 B2 | Page 1 of 1 |
| APPLICATION NO. | : 11/253478 | |
| DATED | : September 8, 2009 | |
| INVENTOR(S) | : Erdogan et al. | |

It is certified that error appears in the above-identified patent and that said Letters Patent is hereby corrected as shown below:

Title Pg, Item (54) title: "MULTIPLEX" to read as --MULTIPLE--

Column 8, line 21, claim 13: "an Q channel" to read as --a Q channel--

Column 8, line 27, claim 15: "linked the" to read as --linked to the--

Column 8, line 33, claim 15: "linked the" to read as --linked to the--

Column 8, line 37, claim 18: "a part a RC" to read as --part of a RC--

Signed and Sealed this
Twenty-first Day of June, 2011

David J. Kappos
*Director of the United States Patent and Trademark Office*

UNITED STATES PATENT AND TRADEMARK OFFICE
CERTIFICATE OF CORRECTION

PATENT NO.         : 7,587,445 B2                                      Page 1 of 1
APPLICATION NO.    : 11/253478
DATED              : September 8, 2009
INVENTOR(S)        : Erdogan et al.

It is certified that error appears in the above-identified patent and that said Letters Patent is hereby corrected as shown below:

Title Pg, Item (54) and at Column 1, line 1, title: "MULTIPLEX" to read as --MULTIPLE--

Column 8, line 21, claim 13: "an Q channel" to read as --a Q channel--

Column 8, line 27, claim 15: "linked the" to read as --linked to the--

Column 8, line 33, claim 15: "linked the" to read as --linked to the--

Column 8, line 37, claim 18: "a part a RC" to read as --part of a RC--

This certificate supersedes the Certificate of Correction issued June 21, 2011.

Signed and Sealed this
Twenty-sixth Day of July, 2011

David J. Kappos
*Director of the United States Patent and Trademark Office*